United States Patent
Kiryu et al.

(10) Patent No.: US 7,055,077 B2
(45) Date of Patent: May 30, 2006

(54) SYSTEMS AND METHODS FOR CIRCUIT TESTING

(75) Inventors: Naoki Kiryu, Austin, TX (US); Louis B. Bushard, Rochester, MN (US)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 10/744,917

(22) Filed: Dec. 23, 2003

(65) Prior Publication Data

US 2005/0138509 A1    Jun. 23, 2005

(51) Int. Cl.
*G01R 31/28*    (2006.01)
(52) U.S. Cl. ...................................... 714/726
(58) Field of Classification Search ............... 714/726, 714/727, 728, 729, 732, 733, 724, 739
See application file for complete search history.

(56) References Cited

U.S. PATENT DOCUMENTS

| | | | |
|---|---|---|---|
| 5,574,733 A | 11/1996 | Kim | |
| 5,783,960 A | 7/1998 | Lackey | |
| 5,983,380 A | 11/1999 | Motika et al. | |
| 6,327,685 B1 * | 12/2001 | Koprowski et al. | 714/733 |
| 6,442,720 B1 | 8/2002 | Koprowski et al. | |
| 6,442,723 B1 | 8/2002 | Koprowski et al. | |
| 6,516,432 B1 * | 2/2003 | Motika et al. | 714/732 |
| 6,807,646 B1 * | 10/2004 | Williams et al. | 714/736 |

* cited by examiner

*Primary Examiner*—Albert DeCady
*Assistant Examiner*—James C. Kerveros
(74) *Attorney, Agent, or Firm*—DLA Piper Rudnick Gray Cary US LLP

(57) ABSTRACT

Systems and methods for improved performance of built-in-self-tests (BISTs) in integrated circuits, where variability is introduced into the self tests to improve the coverage of the tests. In one embodiment, an LBIST system includes scan chains interposed between levels of functional logic in a circuit under test. An exemplary method includes the steps of, for each of one or more initial scan chains, filling the initial scan chains with data comprising a pseudorandom pattern of bits, determining a number of levels of functional circuitry and corresponding subsequent scan chains through which to propagate the data and propagating the data from the initial scan chains through the determined number of levels of functional circuitry and corresponding subsequent scan chains. The number of levels of circuitry through which data is propagated is varied from one test cycle to another based upon a pseudorandom input signal.

23 Claims, 13 Drawing Sheets

SYSTEMS AND METHODS FOR CIRCUIT TESTING

BACKGROUND OF THE INVENTION

Related Art

Digital devices are becoming increasingly complex. As the complexity of these devices increases, there are more and more chances for defects that may impair or impede proper operation of the devices. The testing of these devices is therefore becoming progressively more important.

There are various stages in the life cycle of a device in which testing is important. For example, testing is important in the design of the device, in the manufacturing of the device, and in the operation of the device. At the design stage, testing is intended to verify the design of the device and to identify flaws in the design. Testing may be performed at the architectural level and RTL levels using high level languages or some for of hardware description language (HDL) to simulate the functionality of the device. Simulation testing may also be used to test the gate level design of the device. Testing during the manufacturing of the device may be performed to ensure that the timing, proper operation and performance of the device are as expected from the testing at the design stage. Because the size of features (e.g., transistors and other components) in modern integrated circuits is very small, it is very easy for defects to arise, so testing at this stage is very important. Finally, after the device is manufactured, it may be necessary to test the device to ensure that it continues to operate properly during normal usage.

Logic circuits in digital devices typically include many interconnected logic gates. The various logic gates may include, "AND" gates, "OR" gates, "NAND" gates, "NOR" gates, "NOT" gates, "XOR" gates, and various other types of gates. A logic circuit may receive data through multiple inputs, and may provide resulting output data through multiple outputs. The logic circuit is designed to take the inputs and, depending upon the particular state of the circuit, produce a corresponding predetermined output pattern is produced at the outputs of the circuit. If there is a defect in the logic circuit, then for at least one of the input patterns and corresponding circuit, the patterns produced at the outputs of the circuit will differ from the expected predetermined output patterns.

One way to test for defects in a logic circuit is to apply each possible input pattern at the inputs of the logic circuit, with each possible set of state values in the circuit, and to compare the observed output pattern with the expected output pattern. If there are only a small number of possible input patterns and state values, the cost of storing the input patterns, state information and expected output patterns and then performing deterministic testing of each possible input/state/output combination may be reasonable. If the number of possible input patterns and state values is high, however, the cost of deterministic testing of all the combinations is generally too high. An alternative method of testing that has a lower cost would therefore be desirable.

One alternative method of testing for defects in a logic circuit takes a non-deterministic approach. In this method, random input test patterns are applied to the inputs of the logic circuit, and the output patterns generated by the logic circuit are compared with the expected output patterns. Because this type of testing is not deterministic (i.e., it does not test each and every possible combination of inputs, states and outputs), it does not provide the simple result that the logic circuit either does or does not have any defects. Instead, it provides a level of confidence that the logic circuit does or does not have defects. The greater the number of inputs and states that are tested (i.e., whose outputs are compared to expected values), the higher the confidence level that any defects have been identified by the testing. The number of random test patterns that are needed to achieve a particular level of confidence that the logic circuit contains no defects depends on the design of the logic circuit.

In a variation on this type of testing, the random input test patterns may be weighted. Without weighting, the number of 1's in a random pattern is likely to be very nearly the same as the number of 0's. Weighting can be implemented in order to cause the generated random pattern to more 1's than 0's, or vice versa. For instance, it may be desirable to generate an input test pattern that has 30 percent 0's and 70 percent 1's. The weighted input test patterns are then input to the logic circuit, and the resulting observed output patterns are compared to the expected output patterns to determine whether there are defects in the logic circuit.

As digital devices (e.g., integrated circuits) have become more complex and more densely packed with logic gates and other electronic components, the need for effectively testing these devices has become more important. With respect to the testing of devices, and more particularly manufactured integrated circuits, one mechanism that is very useful is a built-in self test (BIST). This may also be referred to as a logic built-in self test (LBIST).

BIST and LBIST methodologies are generally considered part of a group of methodologies referred to as design-for-test (DFT) methodologies. DFT methodologies involve incorporating features into the actual designs of the circuits that are to be tested to facilitate testing of the circuits. BIST methodologies involve incorporating circuit components into the design of the circuit to be tested, where the additional circuit components are used for purposes of testing the functional portion of the circuitry.

SUMMARY OF THE INVENTION

One or more of the problems outlined above may be solved by the various embodiments of the invention. Broadly speaking, the invention comprises systems and methods for improved performance of built-in-self-tests (BISTs) in integrated circuits, where variability is introduced into the self tests to improve the coverage of the tests.

The invention may be implemented in a variety of ways, and a number of exemplary embodiments will be described in detail below. In one embodiment, a method for testing circuitry includes the steps of, for each of one or more initial scan chains, filling the initial scan chains with data comprising a pseudorandom pattern of bits, determining a number of levels of functional circuitry and corresponding subsequent scan chains through which to propagate the data, and propagating the data from the initial scan chains through the determined number of levels of functional circuitry and corresponding subsequent scan chains.

In an alternative embodiment, a system for testing a circuit under test includes a plurality of scan chains interposed with corresponding levels of the circuit under test and a controller coupled to the scan chains and configured to enable data in at least a portion of the plurality of scan chains to propagate through a variable number of the levels of the circuit under test.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
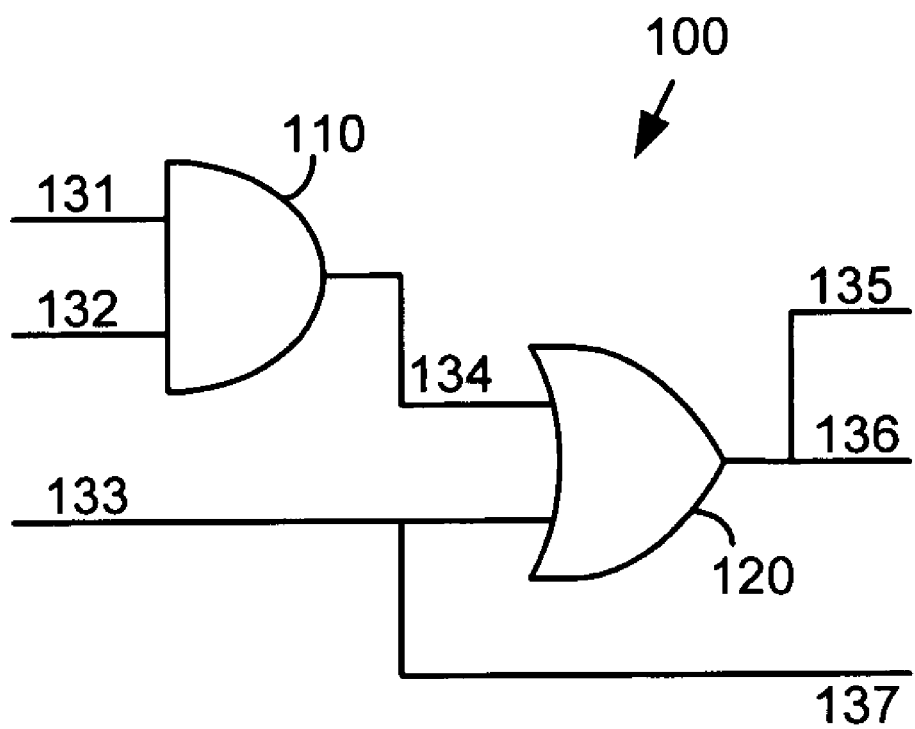
FIG. 1 is a diagram illustrating a simple exemplary logic circuit.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION

One or more embodiments of the invention are described below. It should be noted that these and any other embodiments described below are exemplary and are intended to be illustrative of the invention rather than limiting.

As described herein, various embodiments of the invention comprise systems and methods for improved performance of built-in-self-tests (BISTs) in integrated circuits, where variability is introduced into the self tests to improve the coverage of the tests.

In one embodiment, a method is implemented in an integrated circuit which incorporates components for a logic-built-in-self-test, or LBIST. The LBIST components can include a plurality of scan chains interposed between levels of the functional logic of the circuit under test so that data in one of the scan chains propagates through a level of functional logic to a subsequent scan latch, and potentially through one or more additional levels of functional logic and corresponding subsequent scan chains. One exemplary embodiment comprises a method for testing circuitry including the steps of, for each of one or more initial scan chains, filling the initial scan chains with data comprising a pseudorandom pattern of bits, determining a number of levels of functional circuitry and corresponding subsequent scan chains through which to propagate the data and propagating the data from the initial scan chains through the determined number of levels of functional circuitry and corresponding subsequent scan chains.

In one embodiment, this method may be implemented in built-in-self-test circuitry, and may include the steps of generating a pseudorandom pattern of bits phase shifting the pseudorandom pattern of bits, then scanning the phase shifted pseudorandom pattern of bits into the scan chains. After the data is propagated from the scan chains through one or more levels of logic in the circuit under test, the method may further include the steps of capturing the resulting data, compacting the data and transferring the compacted data to a multiple input signature register (MISR). The compacted data can then be examined and compared to an expected value to determine whether the circuit under test operated in an expected manner.

Another exemplary embodiment comprises a system for testing a circuit under test, where the system includes a plurality of scan chains interposed with corresponding levels of the circuit under test and a controller coupled to the scan chains and configured to enable data in at least a portion of the plurality of scan chains to propagate through a variable number of the levels of the circuit under test.

In one embodiment, this system may include a local control buffer (LCB) that is configured to generate a clock signal to be input to the plurality of scan chains. During a scan phase of a test cycle, the LCB generates a series of clock pulses to shift data through each of the scan chains. During a functional phase of the test cycle, the LCB generates a variable number of clock pulses to cause data to propagate through a corresponding, variable number of levels of the circuit under test. The LCB may be configured to change number of clock pulses in the functional phase based upon a pseudorandom input signal, such as a signal generated by functional logic components in the circuit under test. The system may also include a pseudorandom pattern generator (PRPG) that generates pseudorandom patterns of bits to be scanned into the scan chains and a phase shifter coupled between the PRPG and the scan chains, where the phase shifter shifts the phase of the pseudorandom pattern of bits before the pattern is scanned into the scan chains. The system may further include a multiple input signature register (MISR) configured to operate on data scanned out of the scan chains and to store the result for comparison to an expected value. A compactor may be coupled between the MISR and the scan chains to compact the data and allow a smaller MISR to be used. The system may also include a programmable clock controller (PCC) for generating scan gate (SG) and test hold (THOLD) signals to be used by the LCB in generating the clock signal. The SG signal is also used to control the scan chains to shift data in/out or to receive data from the functional components of the circuit under test.

Another exemplary embodiment comprises an LCB that may be used in a BIST system. The LCB may include inputs for various input signals and logic circuitry to generate a clock signal for the scan chains. The input signals may include a master clock signal, a scan gate (SG) signal, a test hold (THOLD) signal, and an active (ACT) signal. The logic circuitry is configured to receive the input signals, to generate clock pulses in a scan phase to shift pseudorandom bit patterns into the BIST scan chains, to generate clock pulses in a functional phase to propagate the data from the scan chains through some number of levels of the circuit under test, and to provide the generated clock pulses to the BIST scan chains.

In one embodiment, the LCB includes two OR gates and two AND gates. The first AND gate receives the SG signal and a power mode override signal. The first OR gate receives the ACT signal and the output of the first AND gate as inputs. The second AND gate receives the THOLD signal and the output of the first OR gate as inputs. Finally, the second OR gate receives the output of the second AND gate and the master clock signal as inputs and produces the clock signal that can be provided to the scan chains of the BIST.

LBIST testing proceeds generally as follows. First, a pseudorandom pattern is generated. The pseudorandom pattern is scanned into the scan chains, so that the scan latches are populated with bits of the pseudorandom pattern. Next, the bits that are stored in the scan latches are allowed to propagate through the functional logic components to subsequent scan latches. The data in the scan chains is then scanned out of the scan chains, compressed and compared to expected values to determine whether the functional logic components are operating as expected.

The bits stored in the scan latches may be propagated through the functional logic components to the next scan latch, or the data may be propagated through additional functional logic components to the next succeeding scan latch. This may be repeated one or more times, so that, after the data is initially scanned into the scan chains, the data is propagated through multiple scan latches before being scanned out of the scan chains for comparison to known values. In prior art systems, however, the number of scan latches through which the data is propagated is predetermined, and data is propagated through this same number of scan latches before being scanned out of the scan chains each cycle. In one embodiment of the invention, on the other hand, the number of scan latches through which the data is propagated is variable from one cycle to the next. This introduces additional randomness in the manner in which data is processed by the functional logic components of the integrated circuit and thereby improves the fault coverage of the LBIST testing.

The variability that is provided in this embodiment results from the use of a functional logic input to the timing system. Conventionally, a timing mechanism is provided to scan data into the latches of each scan chain, then release the data to propagate through the functional logic components (and through a predetermined number of subsequent scan latches), and finally to scan the resulting data out of the latches of the scan chains so that it can be compared to expected data values.

In the present embodiment, rather than propagating the data through a predetermined number of subsequent scan latches, the number of subsequent scan latches is determined by an input to the timing circuitry that is coupled to the functional logic components themselves. As a result, in one cycle, the data may be propagated through the functional logic components to the next scan latch, and then scanned out of the scan chains. In the next cycle, the data may be propagated through an additional level of functional logic components and on to the next scan latch. In the next cycle, the data may be propagated to a single succeeding scan latch, or through a series of scan latches before being scanned out of the scan chain. Because the number of levels of functional logic and scan latches through which the data is propagated is not predetermined, the patterns of data which are propagated through the logic components are more random than if the data is propagated through a predetermined number of levels. The coverage of the testing is therefore improved.

Various embodiments of the invention will be described below. Primarily, these embodiments will focus on implementations of a STUMPS-type LBIST architecture which is implemented within an integrated circuit. It should be noted that these embodiments are intended to be illustrative rather than limiting, and alternative embodiments may be implemented in BIST architectures other than the STUMPS architecture, and may also be implemented in circuits whose components are not strictly limited to logic components (e.g., AND gates, OR gates, and the like). Many such variations will be apparent to persons of ordinary skill in the art of the invention and are intended to be encompassed by the appended claims.

Before describing the invention, it may be helpful to first describe the purposes of built-in-self-tests and the manner in which these tests are usually implemented. Referring to FIG. 1, a simple logic circuit 100 is shown. Logic circuit 100 comprises two logic gates—AND gate 110 and OR gate 120. There are three inputs to logic circuit 100. These inputs are provided through interconnects 131–132. There are also three outputs from logic circuit 100, which are provided through interconnects 135–137.

In logic circuit 100 of FIG. 1, AND gate 110 receives inputs from interconnects 131 and 132. AND gate 110 produces an output on interconnects 134 corresponding to the received inputs. The output of AND gate 110 is carried by interconnect 134 to one of the inputs of OR gate 120. A second input to OR gate 120 is provided through interconnect 133. OR gate 120 produces an output which is carried on interconnects 135 and 136. The input which is provided to logic circuit 100 on interconnect 133 is passed directly through to interconnect 137 and is thereby provided as an output of logic circuit 100.

Logic circuit 100 provides a particular set of output values corresponding to a given set of input values. The input values and corresponding output values can be expressed as a truth table for logic circuit 100. This table is shown below as Table 1. The truth table shown in Table 1 defines the proper operation of logic circuit 100. If an instantiation of logic circuit 100 does not provided the specific output values shown in Table 1 corresponding to the specific input values, then this instantiation of logic circuit 100 is defective.

TABLE 1

| inputs | | | outputs | | |
|---|---|---|---|---|---|
| 131 | 132 | 133 | 135 | 136 | 137 |
| 0 | 0 | 0 | 0 | 0 | 0 |
| 0 | 0 | 1 | 1 | 1 | 1 |
| 0 | 1 | 0 | 0 | 0 | 0 |
| 0 | 1 | 1 | 1 | 1 | 1 |
| 1 | 0 | 0 | 0 | 0 | 0 |
| 1 | 0 | 1 | 1 | 1 | 1 |

TABLE 1-continued

| inputs | | | outputs | | |
|---|---|---|---|---|---|
| 131 | 132 | 133 | 135 | 136 | 137 |
| 1 | 1 | 0 | 1 | 1 | 0 |
| 1 | 1 | 1 | 1 | 1 | 1 |

The purpose of the LBIST is to provide a means to determine whether or not a particular instantiation of logic circuit 100 is operating correctly, or is defective. This means is provided within the integrated circuit that contains logic circuit 100.

Figure 2:
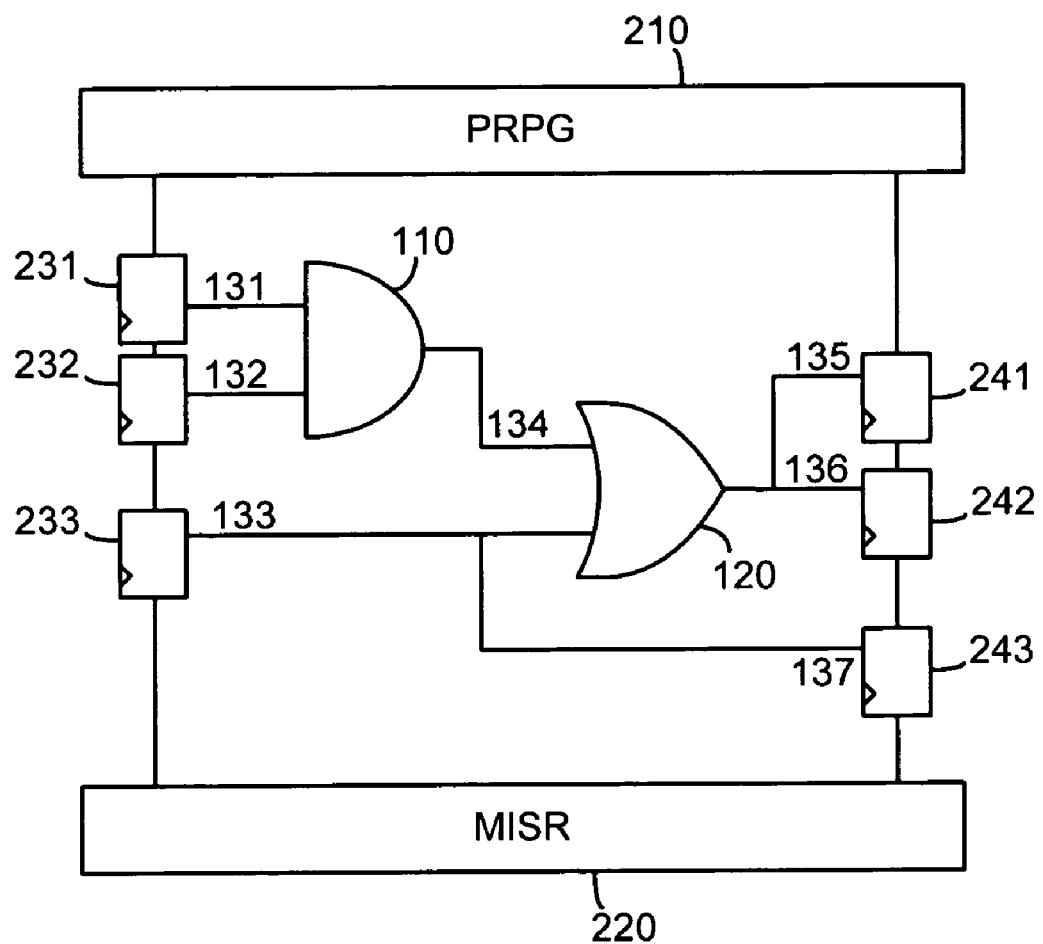
FIG. 2 is a diagram illustrating the exemplary logic circuit of FIG. 1 and additional LBIST components for testing the logic circuit.

The LBIST functionality is provided by incorporating a set of corresponding LBIST components into the design of logic circuit 100. Referring to FIG. 2, a design which includes both logic circuit 100 and the additional LBIST components is shown. The LBIST components include a pseudorandom pattern generator (PRPG) 210, multiple input signature register (MISR) 220, a first set of latches 231–233, and a second set of latches 241–243.

Each one of the first set of latches 231–233 (a first scan chain) is coupled to a corresponding one of the inputs 131–133 of logic circuit 100. Similarly, each one of the second set of latches 241–243 (a second scan chain) is coupled to a corresponding one of the outputs 135–137 of logic circuit 100. The purpose of each of the first set of latches 231–233 is to store a data bit which will be propagated through logic circuit 100. After these data bits are propagated through logic circuit 100, the resulting outputs of the logic circuit will be stored in the second set of latches 241–243. Thus, logic circuit 100 can be tested by storing a set of data bits in latches 231–233, propagating these data bits through logic circuit 100, and determining whether the resulting data bits that are stored in latches 241–243 correspond to the correct output data bits as defined in the truth table for logic circuit 100 (see Table 1).

In order to test logic circuit 100 for all of the possible combinations of input values, it would be necessary to apply each combination of input data bits from the first three columns of Table 1 to logic circuit 100. In other words, each of these combinations would have to be stored in input latches 231–233, and the resulting data bits in output latches 241–243 would have to be compared to the corresponding output bits shown in Table 1. Since there are only three inputs to logic circuit 100, there are only eight possible combinations of input bits (since 23=8). The testing of these eight possible combinations of input values may very well be feasible. If, however, logic circuit 100 were more complex and had more inputs, it would be necessary to apply more combinations of input values to the logic circuit in order to completely test the logic circuit for proper operation. Generally speaking, if the logic circuit has n inputs, it would be necessary to apply 2n different combinations of input values to the logic circuit in order to completely test the circuit. It is easy to see how the logic circuit may quickly become too complex for each and every combination of input values to be tested.

In order to address the issue of having too many distinct combinations of input data values to allow testing of each and every combination, one approach makes use of sequences comprising random (or more specifically, pseudorandom) patterns of data bits which are applied to the inputs of the logic circuit. In the case of the circuit illustrated in FIG. 2, these data random patterns of data bits are generated by PRPG 210, and are then loaded into input latches 231–233. If the number of pseudorandom bit patterns that are loaded from PRPG 210 into input latches 231–233 is sufficiently high, the tester can have a certain level of confidence that logic circuit 100 has been thoroughly tested and, assuming that correct output data bits have been generated in response to these test sequences, that logic circuit 100 has no defects and is operating correctly.

It should be noted that the circuit of FIG. 2 includes a MISR 220. The purpose of MISR 220 is to speed up the testing of logic circuit 100. This is accomplished by using MISR 220 to accumulate the results which were propagated by logic circuit 100 to latches 241–243. Thus, rather than loading a pseudorandom bit sequence into latches 231–233, propagating this data through logic circuit 100 to latches 241–243 and then comparing the contents of latches 241–243 with the expected output values, the values stored in latches 241–243 are unloaded to MISR 220, the contents of which are modified based upon the data from latches 241–243. In one embodiment, MISR 220 is configured to perform a modulo operation on the data. The result of the modulo operation is stored in MISR 220 and, at the end of the next test cycle, is used to perform another modulo operation.

Because the pseudorandom input bit patterns and corresponding output bit patterns are known, the content of MISR 220 based upon the unloaded output bits is also known. Consequently, the process of loading pseudorandom patterns of input bits, processing these bits through logic circuit 100 to produce the output bits, operating on these output bits and storing the result in MISR 220 can be repeated for a number of cycles, after which the final contents of MISR 220 can be compared to a single expected value. If the data stored in MISR 220 matches the expected value, logic circuit 100 has operated as expected, and no defects have been found in the circuit.

The purpose of this type of testing is to process different sets of data values through the logic circuit. These sets of data values are intended to be roughly equivalent to random data values so that the thoroughness of the testing can be determined using statistical principles relating to random numbers. Thus, the test system makes use of pseudorandom numbers (e.g., has generated by the PRPG). One advantage of using pseudorandom numbers is that, while the numbers (bit sequences) themselves are essentially equivalent to random numbers, the pseudorandom bit sequences that is used to test one logic circuit can be repeated in the testing of another logic circuit. Then, because the pseudorandom bit sequences input to each of the logic circuits during testing is the same, the results of the testing should also be exactly the same. Therefore, the testing of a logic circuit can be performed by providing essentially "random" input bit sequences to circuit and comparing the corresponding output to an expected output. If the outputs are the same, then the logic circuit under test has operated in the same manner as the control circuit (or circuit simulation) which was used to generate the "expected" output.

The discussion above relating to FIGS. 1 and 2 focuses on the testing of logic circuit 100, which is obviously a very small circuit in comparison to most, if not all, integrated circuits that might be used in current applications. The use of LBIST to test larger-scale logic circuits is therefore described in the following paragraphs.

Figure 3:
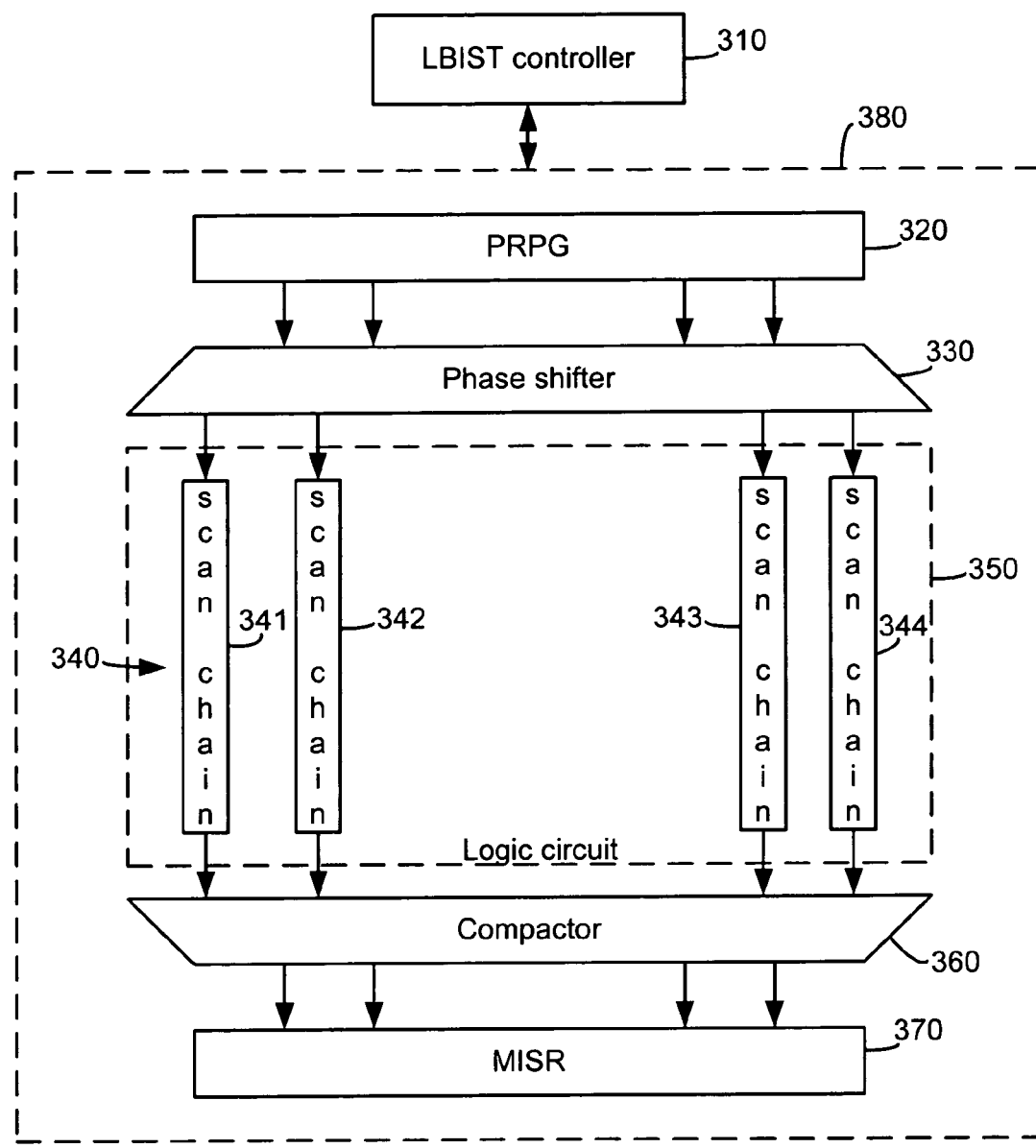
FIG. 3 is a functional block diagram illustrating an LBIST architecture that can be used in conjunction with the testing of large-scale logic circuits.

Referring to FIG. 3, a functional block diagram illustrating an LBIST architecture that can be used in conjunction with the testing of logic circuits, including large-scale logic circuits is shown. This architecture is generally known as the STUMPS LBIST architecture. The STUMPS architecture makes use of pseudorandom patterns that are loaded into scan latches, propagated through the functional components of the logic circuit under test, unloaded from the scan latches, and captured in a multiple input signature register, very much like the small-scale circuit described above.

As depicted in FIG. 3, the STUMPS architecture comprises an LBIST controller 310, a PRPG 320, a phase shifter 330, a set of scan chains 340, a compacter 360 and a MISR 370. These LBIST components are integrated with a logic circuit 350, which the LBIST components are designed to test.

LBIST controller 310 includes control circuitry, such as the PCC described in more detail in connection with FIGS. 11–13, that controls the operation of the remainder of the LBIST components 380. (For purposes of clarity, LBIST controller 310 is depicted as being coupled to LBIST components 380 as a group, although the controller is typically coupled directly to each of the components.) One of the functions of LBIST controller 310 is to provide a seed value to PRPG 320. Based upon this seed value, PRPG 320 generates a pseudorandom sequence of bits that are processed by phase shifter 330 and loaded into scan chains 340.

Figure 4:
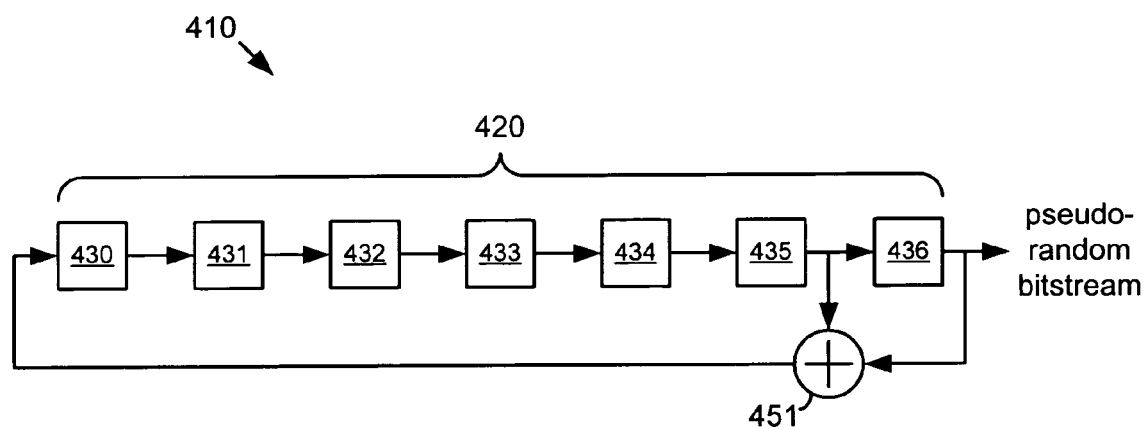
FIG. 4 is a diagram illustrating the functional structure of an exemplary LFSR.

PRPG 320 can be implemented as a linear feedback shift register (LFSR). Referring to FIG. 4, a diagram illustrating the functional structure of a LFSR in accordance with one embodiment is shown. LFSR 410 comprises a shift register 420 having a plurality of individual bit registers (430–436). Individual bit registers 430–436 are coupled together so that, upon each clock cycle, a bit stored in one bit register is shifted to the next bit register. For example, the bit stored in bit register 430 is shifted to the register 431, while the bit stored in bit register 431 is shifted to bit register 432, and so on. In the case of bit register 436, the bit stored therein is not shifted to another bit register, but is instead provided as the output of the LFSR.

In a LFSR, feedback is typically generated by providing several of the bits in the shift register to XOR gate 451 and feeding the output of XOR gate 451 back into shift register 420. In the configuration illustrated in FIG. 4, the bits from bit registers 435 and 436 are used as feedback to generate a bit to be shifted into bit register 430. Thus, a seed value (or bit sequence) is initially stored in bit registers 430–436 and, as these initial bits are shifted out of bit register 436, new bits generated from the feedback are stored in bit register 430. The bits that are shifted out of bit register 6 thereby provide a pseudorandom sequence of bits that can be used in the LBIST circuit.

The purpose of the pseudorandom sequence of bits generated by PRPG 320 is to provide a set of input bits to be propagated through the functional logic components of logic circuit 350. The pseudorandom sequence is therefore provided to each of the scan chains 340. It should be noted, however, that the pseudorandom bit sequence is loaded into scan chains 340 only after being processed by phase shifter 330.

It should be noted that, while only four scan chains are depicted in the FIG. 3, there may be many scan chains in the LBIST design. If more scan chains are included in the design, more fine-grained testing of the logic circuit can be performed. In other words, if there are more scan chains in the design, fewer of the components of the logic circuit are positioned between successive scan chains. The specific number of scan chains in a particular design will depend on various factors that will not be discussed in detail herein, as they are not required to understand the invention.

Figure 5A:
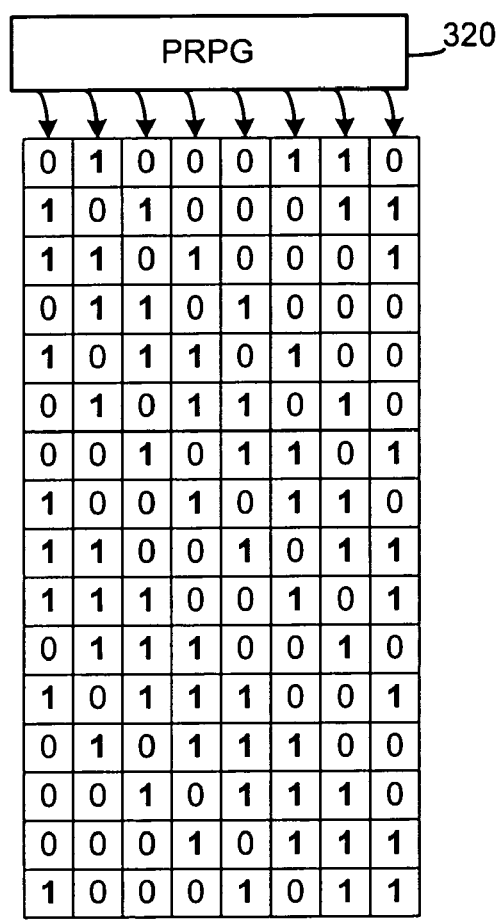
FIGS. 5A and 5B are diagrams illustrating pseudorandom bit sequences provided by a PRPG and/or phase shifter to a series of scan chains.

The purpose of phase shifter 330 is to make the character of the bit sequence is loaded into scan chains 340 more random. This can be explained with respect to FIGS. 5A and 5B. FIG. 5A is a diagram illustrating a pseudorandom bit sequence provided by PRPG 320 for each of a series of scan chains. The diagram of FIG. 5A comprises a table in which each column represents a pseudorandom bit sequence provided to one of scan chains 340. For example, the first column may represent the bit sequence provided to scan chain 341, while the second column may represent the bit sequence provided to scan chain 342, and so on. It can be seen from the figure that the sequence in each successive column is identical to the sequence in the preceding column, except that the sequence is shifted down by one bit. Thus, there is a clearly identifiable pattern within the "random" sequences of bits. Phase shifter 330 shifts the phase of the pseudorandom sequence of bits so that no such pattern is identifiable within the succeeding bit sequences.

Figure 5B:
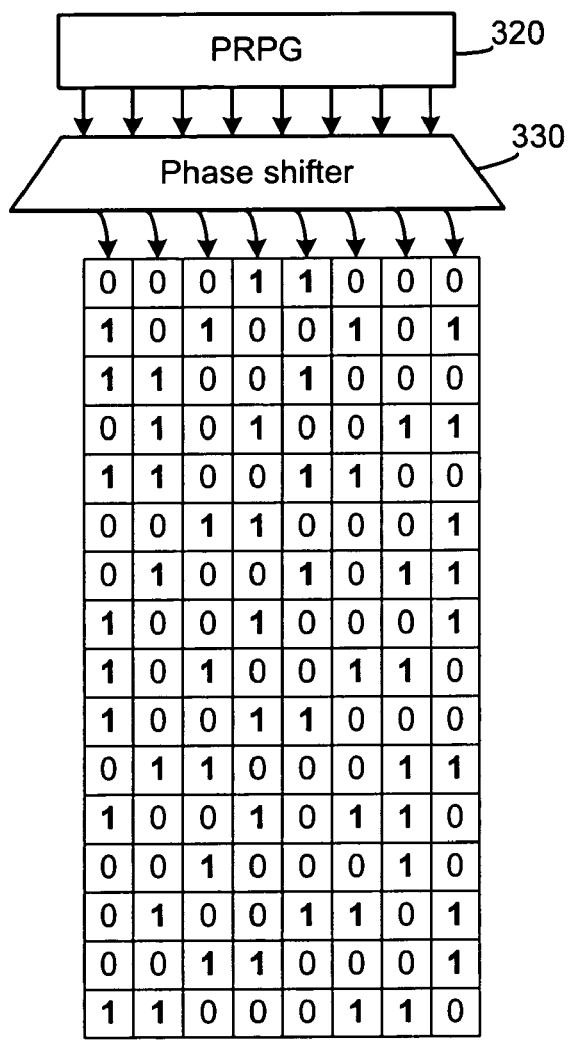

Essentially, phase shifter 330 operates by shifting the phase of each succeeding column with respect to the preceding column. In other words, rather than being offset by a single bit in each succeeding column, the bit patterns in succeeding columns are shifted by different amounts. For instance, as shown in FIG. 5B, the bit sequence in the second column is shifted outboard by five bits, rather than being shifted downward by one bit. Similar shifts are implemented between each of the succeeding columns in the table of FIG. 5B. The result is a table in which there is no easily discernible pattern between the bit sequences in adjacent columns. This improved randomization of the pseudorandom bit sequence which is loaded into scan chains 340 can improve the fault coverage and effectiveness of the LBIST testing. While not essential to the test architecture, phase shifter 330 therefore improves the operation of the test circuitry.

The pseudorandom bit patterns that are generated by PRPG 320 and phase shifter 330 are loaded into scan chains 340. Each of scan chains 340 comprises a series of scan latches that are configured to alternately shift data (the pseudorandom bit patterns or functional logic output) through the scan chains or to hold data that has been propagated through the functional logic. This will be explained in more detail with respect to FIG. 6. As indicated above, a separate sequence is loaded into each of scan chains 340. Each of scan chains 340 is positioned before or after (interposed with) respective portions of logic circuit 350. Thus, for each portion of logic circuit 350, there is a scan chain which precedes this portion and provides inputs to the corresponding logic, as well as a scan chain which follows this portion and receives the output of the corresponding logic. The scan chains thereby define "levels" of the logic circuit (portions of the logic circuit between successive scan chains). For example, one level of logic circuit 350 may receive input bits from scan chain 341 and provide output bits to scan chain 342. Similarly, another level of logic circuit 350 may receive input bits from scan chain 343 and provide output bits to scan chain 344. It should be noted that some of scan chains 340 may serve both to provide input bits to a succeeding level of logic circuit 350 and to receive output bits from a preceding level of logic circuit 350.

After the pseudorandom bit patterns have been allowed to propagate through the functional components of logic circuit 350 and the results have been captured in scan chains 340, the contents of scan chains 340 are scanned out of the scan chains (i.e., they are unloaded from the scan chains) to compactor 360 and MISR 370. The purpose of compactor 360 is simply to reduce the number of bits that have to be handled by MISR 370. Compactor 360 may be implemented in a number of ways. Typically, compactor 360 will employ a series of XOR gates, where the output of each XOR gate is based upon inputs received from a pair of scan chains. The number of bits that are then passed to MISR 370 can therefore be reduced by a factor of 2. In alternative environments, more complex circuitry may allow the number of bits to be reduced by an even greater factor.

After the bits from scan chains 340 have been compacted by compactor 360, they are provided to MISR 370. MISR 370 provides a means to observe the resulting data bits and to compare this information to the expected output of the test system. Typically, rather than comparing the output of scan chains 340 (and/or compactor 360) after each functional cycle (during which data is propagated through the functional components of logic circuit 350), MISR 370 enables the observation of a cumulative value that is based upon the output of the scan chains at each cycle. For example, in one embodiment, MISR 370 performs a modulo operation on the output of compactor 360. That is, MISR 370 divides the current value stored in MISR 370 by the output of compactor 360, and retains the remainder from this computation. This computation is performed, and the value stored in MISR 370 is updated, after each functional cycle. After a predetermined number of functional cycles, the value stored in MISR 370 is compared to an expected value. If the stored value does not match the expected value, then one or more of the operations performed by the functional components of logic circuit 350 failed, thereby providing an incorrect data bit in the output scan chain, which then propagated through compactor 360 to MISR 370.

Figure 6:
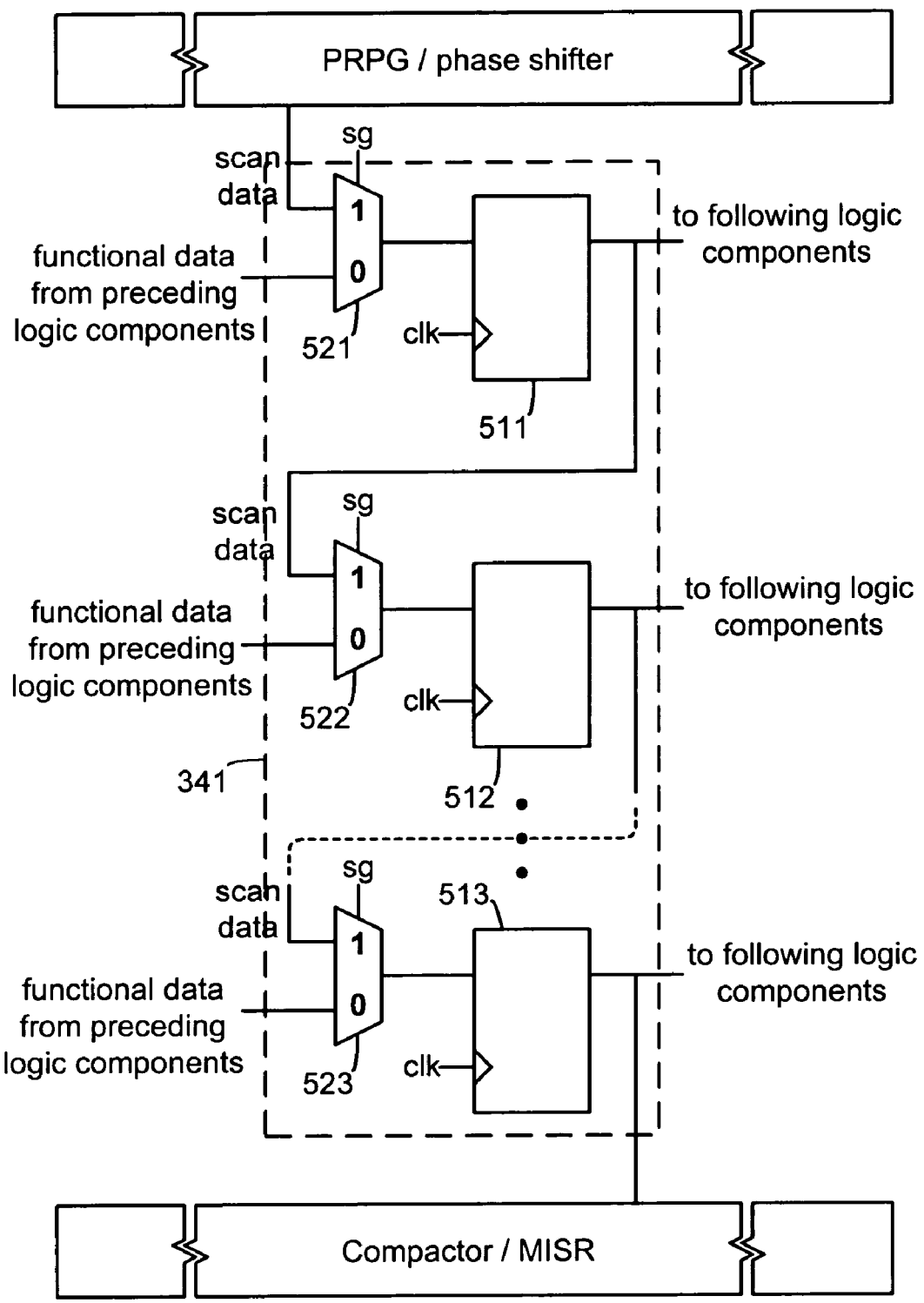
FIG. 6 is a functional block diagram illustrating the structure of one or more scan chains in accordance with one embodiment.

Referring to FIG. 6, a functional block diagram illustrating the structure of scan chains 340 in one embodiment is shown. FIG. 6 depicts a single scan chain 341. The other scan chains that form part of the LBIST structure are similarly constructed. Scan chain 341 includes a series of scan latches 511–513. Each of scan latches 511–513 has a corresponding demultiplexer 521–523. Each of demultiplexers 521–523 has a control input which causes the demultiplexer is to select either scan data or functional data.

While only three scan latches (and corresponding demultiplexers) are shown in the FIG. 6, these scan latches are merely illustrative of the series of scan latches. Scan chain 341 may include hundreds, thousands, or even tens of thousands of scan latches. In one embodiment, scan chain 341 includes 1000 scan latches. As noted above, each of these scan latches has a corresponding demultiplexer.

As described above, the purpose of scan chain 341 is to store data bits. These data bits may either be input data bits that will be propagated through subsequent functional logic components, or output data bits that have already been propagated through functional logic components. Initially, scan chain 341 will store input data bits. These data bits comprise the pseudorandom sequence of bits that are generated by the PRPG and processed by the phase shifter as described above. In order to load the pseudorandom sequence(s) of bits into the scan latches of scan chain 341, a scan gate signal (SG) is asserted. When the scan gate signal is asserted, scan data is selected by demultiplexers 521–523 and is shifted through the scan latches. In other words, a pseudorandom bit sequence is shifted from the PRPG/phase shifter into scan chain 341, and the data which was previously stored in scan chain 341 is shifted into the compactor/MISR. At the component level, a bit is shifted from the PRPG/phase shifter into scan latch 511, a bit is shifted from scan latch 511 into scan latch 512, and so on, until a bit is shifted from scan latch 513 to the compactor/MISR. Thus, over n clock cycles, n bits of a pseudorandom bit sequence are shifted into scan chain 341, while n bits of data (produced by the propagation of bits through the functional logic components) are shifted out of scan chain 341.

After each of scan latches 511–513 of scan chain 341 is loaded with one of the bits of the pseudorandom bit sequence from the PRPG/phase shifter, these bits can be propagated through the functional components of the logic circuit to test its operation. When each bit is stored in the corresponding scan latch, this bit value becomes available to the functional logic components that follows the scan latch. The value therefore begins to propagated through these logic components. This occurs whether the scan gate signal is asserted or deasserted. If the scan gate signal is asserted, each scan latch is loaded with the bit value of the preceding scan latch. If the scan gate signal is deasserted, however, demultiplexers 521–523 select their respective functional data inputs instead of the scan data inputs. As a result, the scan latches store the data bits that have propagated through the preceding functional logic components. In other words, the scan latches perform a functional capture of the data produced by the logic components. After this data has been captured, the scan gate signal can be asserted again, causing the captured data to be scanned out of scan chain 341 while a new pseudorandom bit sequence is scanned into scan chain 341.

While the data that is shifted through scan latches 511–513 is selected based upon the scan data signal, the data is actually shifted into scan latches 511–513 based upon the clock signal (clk) that is provided to each of scan latches 511–513. At each clock cycle, a new data value is scanned into each of scan latches 511–513. Exemplary clock signals are shown in FIGS. 7A and 7B.

Figure 7A:
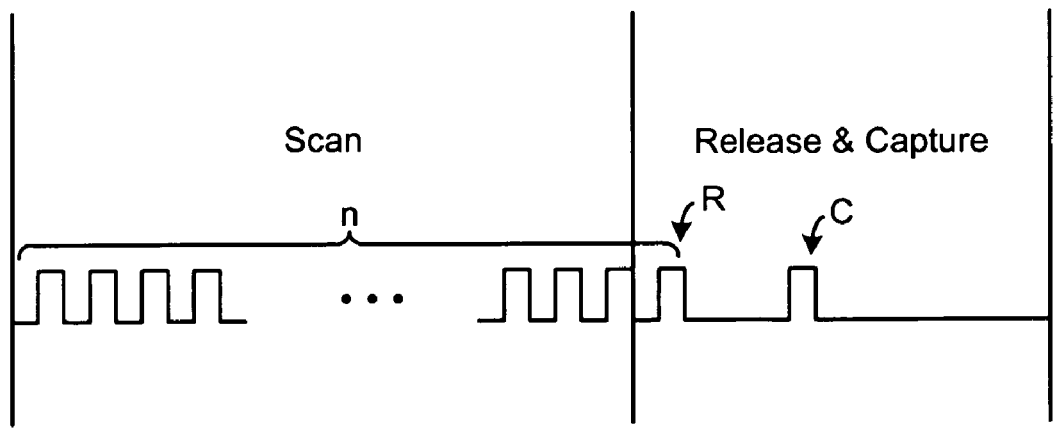
FIGS. 7A and 7B are diagrams illustrating exemplary clock signals for scanning data into and out of scan chains, and for releasing and capturing data propagating through the functional logic components of a circuit under test.
Figure 7B:
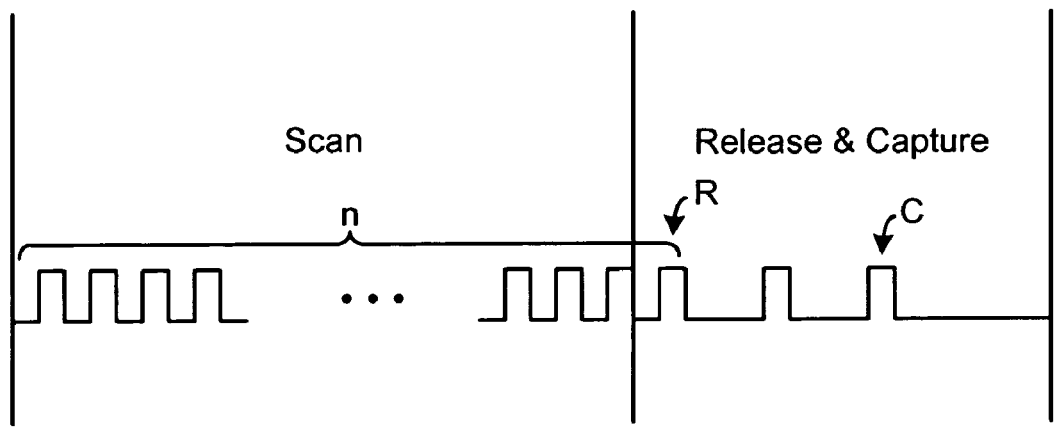

Referring to FIGS. 7A and 7B, diagrams illustrating the clock signals that are provided to scan latches 511–513 are shown. FIG. 7A illustrates a clock signal corresponding to what is sometimes referred to as a skewed-load method, while FIG. 7B illustrates a clock signal corresponding to what is sometimes referred to as a broad-side method. Conventionally, the LBIST design for a particular logic circuit will operate according to one of these methods. Each of these figures can be divided into two parts, each of which corresponds to a different part of the testing cycle. The part of the figure on the left corresponds to a scan phase of the testing cycle. The part of the figure on the right corresponds to a functional testing phase of the testing cycle. This phase of the testing cycle is sometimes referred to as the "release and capture" phase. This phase may also being referred to as a "functional" phase, because the data is allowed to propagated through the functional components of the logic circuit.

During the scan phase, the scan gate signal is asserted and the pseudorandom bit sequence generated by the PRPG/phase shifter is scanned into the scan latches of the scan chain as described above. Because the pseudorandom bit sequence is serially shifted into the scan latches, one latch at a time, one clock cycle is required in the scan phase for each scan latch in the scan chain. Consequently, if there are 10 scan latches in the scan chain, the scan phase requires 10 clock cycles to load the pseudorandom bit sequence into the scan chain. If there are 1000 scan latches in the scan chain, the scan phase requires 1000 clock cycles.

During the functional testing or release and capture phase, the data that is already stored in the scan latches is allowed to propagate through the logic components that follow the respective scan latches. The "release" of the data to propagate through the logic components occurs on the last clock cycle that loads the pseudorandom bit sequence into the scan chain. This clock cycle is indicated by an "R" in FIG. 7A. The scan gate signal is asserted for this last clock cycle, and is then deasserted. Consequently, no further data bits are shifted from one scan latch to another. Because the scan gate signal is now deasserted, the next clock cycle causes the scan latches to capture the data values that have propagated through the corresponding functional logic components. This is referred to as the "capture" of the data. This clock cycle is indicated by a "C" in FIG. 7A. The scan phase and release and capture phase together form a test cycle. In each test cycle, a pseudorandom bit sequence is loaded into the scan chains, propagated through functional logic components, and then unloaded from the scan chains. After the release and capture phase is completed, the cycle repeats with the scan phase.

Referring to FIG. 7B, a slightly different timing sequence is illustrated. In this instance, the scan phase is the same, but the release and capture phase is different. Rather than having two pulses of the clock signal, there are three pulses. As was the case with the timing of FIG. 7A, the scan gate signal is asserted during the scan phase and the pseudorandom bit sequence generated by the PRPG/phase shifter is scanned into the scan latches, one latch per clock pulse (cycle). The last clock cycle that loads the pseudorandom bit sequence into the scan chain is the first cycle of the release and capture phase. The data that is stored in the scan latches is allowed to propagate through the logic components in a manner similar to FIG. 7A, but instead of capturing the data on the next clock cycle, the data is allowed to propagate through another level of the functional logic. In other words, rather than loading the scan chains, propagating the loaded data through a single level of functional logic components and then unloading the resulting data from the scan chains, the data is loaded into the scan chains, propagating through two levels of functional logic and then unloaded from the scan chains.

The pseudorandom bit sequences that are loaded into the scan chains can be propagated through additional levels of logic. This is accomplished by providing corresponding additional pulses to the clock signal in the same manner as shown in FIG. 7B (except that the release and capture phase may have four, five, or even more clock pulses.

It should be noted that the clock pulses shown in FIGS. 7A and 7B are not shown to scale. That is, the spacing of the pulses can be significantly different than that represented in these figures. Typically, the clock pulses during the scan phase will occur at a lower rate then the clock pulses during the release and capture phase. The spacing between the clock pulses in the release and capture phase will therefore typically be much smaller than the spacing between the scan phase clock pulses. This is because the LBIST components which are used to clock the pseudorandom bit sequences into and out of the scan chains are typically designed to operate at a lower clock rate then the functional logic components which are being tested. If the LBIST components were required to operate at the same clock speed as the functional logic components, the cost of the LBIST components would be substantially higher. Thus, data is typically clocked into and out of the scan chains at a lower clock speed (e.g., 500 MHz), while the functional logic components are tested at the clock rate at which they are expected to normally operate (e.g., 2 GHz).

Figure 8:
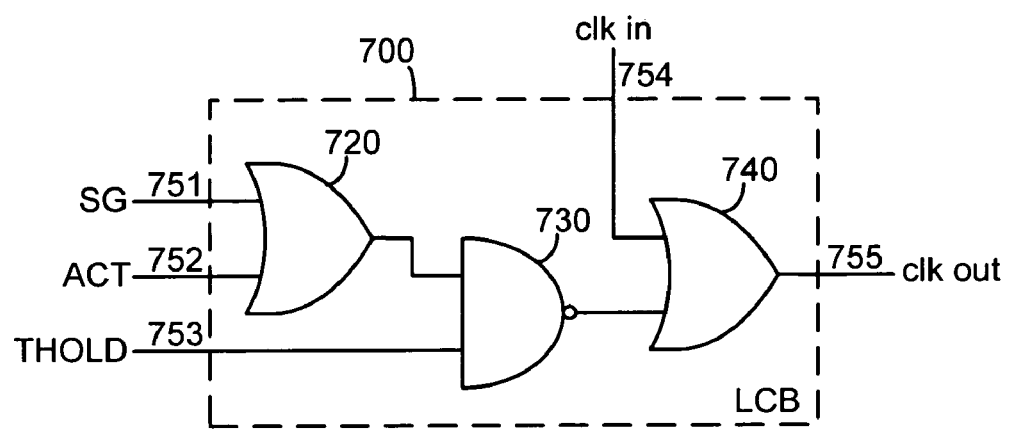
FIG. 8 is a diagram illustrating the design of a local control buffer in accordance with one embodiment.

In one embodiment of the present invention, the clock signal is generated by a local control buffer (LCB). Referring to FIG. 8, a diagram illustrating the design of an LCB in accordance with one embodiment is shown. As shown in FIG. 8, LCB 700 comprises a series of logic gates, including AND gate 730 and OR gates 720 and 740.

As shown in FIG. 8, LCB 700 can have four inputs. The four inputs are configured to be coupled to receive input signals which are used to control the output clock signal at output 755. Input 751 is coupled to the input of OR gate 720 and is configured to receive a scan gate signal. This is the same scan gate signal that is mentioned above in relation to FIGS. 7A and 7B. Input 752 is coupled to an input of OR gate 720 and is configured to receive an active (ACT) signal. In one embodiment, the ACT signal is dependent upon the functional logic within the logic circuit being tested. Input 753 is coupled to an input of NAND gate 730, and is configured to receive a test hold (THOLD) signal. The THOLD signal is intended to prevent new data from being launched from the scan latches. Finally, input 754 is coupled to one of the inputs of OR gate 740. Input 754 is coupled to a clock source and is configured to receive a master clock signal upon which the output of LCB 700 is based.

Logic gates 720, 730 and 740 are cascaded. That is, the output of OR gate 720 is provided as an input to NAND gate 730, and the output of NAND gate 730 is provided as an input to OR gate 740. The respective states of the SG, ACT and THOLD signals control whether the clock signal received on input 754 is passed through LCB 700. THOLD has the highest priority of these signals. If THOLD is not asserted, the output of NAND gate 730 is 1, so the output of OR gate 740 remains at a value of 1. In other words, no clock pulses are produced. If THOLD is asserted, the output of NAND gate 730 is dependent upon the input received from OR gate 720. If OR gate 720 produces a value of 1, the output of NAND gate 730 is 0, so the master clock signal received on input 754 will be passed through OR gate 740. The output of OR gate 720 is dependent upon the SG and ACT signals. The output of OR gate 720 will be 0 only if neither the ACT signal nor the SG is asserted. Otherwise, the output of OR gate 720 will be 1. The resulting truth table for gates LCB 700 is shown in Table 2.

TABLE 2

| inputs | | | |
|---|---|---|---|
| 751 SG | 752 ACT | 753 THOLD | clock enabled |
| 0 | 0 | 1 | no |
| 1 | 0 | 1 | yes |
| 0/1 | 1 | 1 | yes |
| 0/1 | 0/1 | 0 | no |

Referring again to FIGS. 7A and 7B, the LCB serves to provide variation in the release and capture phase of the test cycle. In other words, by introducing the ACT signal, the LCB may or may not suppress one or more of the clock pulses that would otherwise be generated in the release and capture phase. Therefore, depending upon the ACT signal, the release and capture phase may have two, three or even more pulses, allowing the data from the scan chains to propagate through one, two or more levels of functional logic, respectively.

It should be noted that, while the ACT signal in this embodiment is generated by the actual functional logic, it is not necessary to provide the signal in this manner. For instance, the ACT signal may be produced by a pseudorandom bit sequence generator that is based upon the same seed value that determines the pseudorandom bit sequence generated by the PRPG of the LBIST. The ACT signal simply needs to be a pseudorandom signal that is repeatable in the same manner as the bit sequences that are shifted into the scan chains (so that the values in the MISR will be repeatable and therefore indicative of proper operation of the circuit under test).

The master clock signal received by LCB 700 is an input to OR gate 740, along with the output of AND gate 730. Consequently, when the master clock signal is passed through OR gate 740, it is effectively inverted. In other words, when the clock is disabled, the output of OR gate 740 is at a value of 1.

Figure 9:
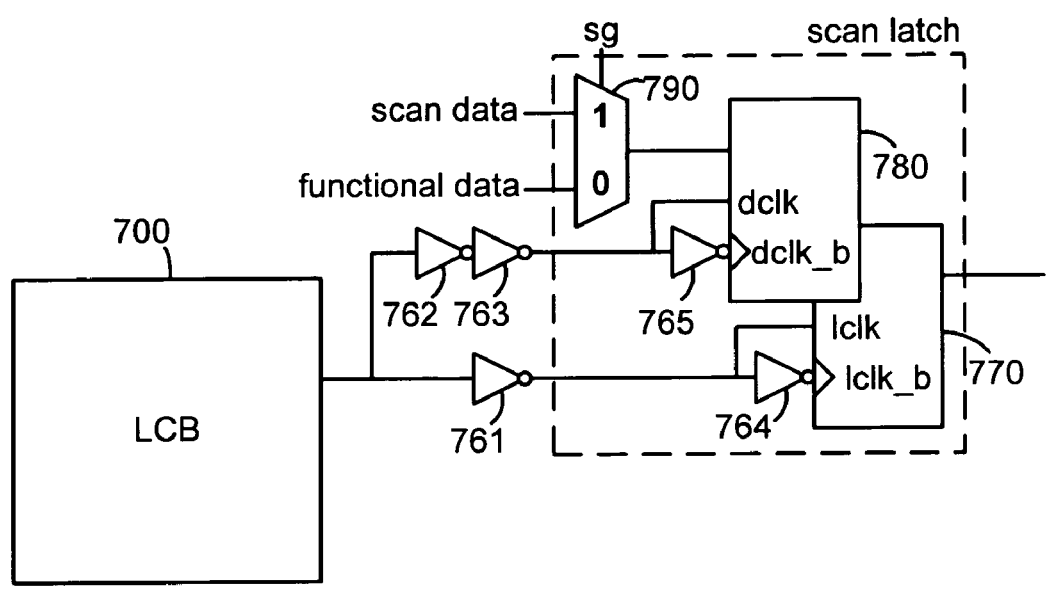
FIG. 9 is a diagram illustrating the manner in which a clock signal is delivered from a local control buffer to a set of scan latches in accordance with one embodiment.

Referring to FIG. 9, a diagram illustrating the manner in which the clock signal is delivered from LCB 700 to the scan latches is shown. When the clock is enabled, the clock signal provided by LCB 700 is split into two paths. On one path, the clock signal is inverted by inverter 761. This signal is then split and delivered to flip-flop 770 in this form and also after being inverted again by inverter 764. On the other path, the clock signal generated by LCB 700 is inverted twice by inverters 762 and 763. The resulting clock signal is then split and delivered to flip-flop 780 in this form and also after being inverted again by inverter 765. The inverted and non-inverted clock signals are then used to latch the scan data or functional data received from demultiplexer 790.

Of the four input signals to LCB 700, THOLD has the highest priority. If the THOLD signal is not asserted, no clock pulses will be generated and data will not be shifted through the LBIST components or the functional logic components. If the THOLD signal is asserted, the LBIST circuitry and the functional logic circuitry can operate, depending upon whether the remaining input signals to LCB 700 enable the clock signal. As described above, the SG signal is asserted to select the scan dat apath for the scan latches. The SG signal also enables the clock signal so that the pseudorandom bit sequence from the PRPG can be clocked (shifted) into the scan latches of each scan chain.

The ACT signal that is input to the LCB performs a function that is not found in conventional LBIST designs. As noted above, the release and capture phase of the test cycle may enable the data from the scan latches to propagate through a single level of functional logic, or through multiple levels of functional logic, where a "level" of logic is the portion of the logic circuit that data traverses in propagating from one scan latch to the next scan latch (or from one scan chain to the next scan chain). The number of levels of functional logic through which the data propagates depends upon the number of clock pulses in the release and capture phase. If there are two clock pulses, the data is released from one scan chain and captured in the next scan chain. If there are three clock pulses, the data is released from a first scan chain, propagated through two levels of functional logic (and a second scan chain), and captured in a third scan chain. Additional clock pulses allow the data to propagate through additional evels of functional logic. The purpose of the ACT signal is to control the number of clock pulses in the release and capture phase and to thereby control the number of levels of functional logic through which the data propagates.

As noted above, the ACT signal is dependent upon functional logic. This may be functional logic that is already in the logic circuit under test, or it may be separate logic that is designed for the purpose of generating an ACT signal. In either case, the ACT signal is caused to vary throughout the testing. The variations in the ACT signal cause the number of clock pulses in the release and capture phase to vary and thereby also causes the number of levels of functional logic through which the data propagates to vary. This provides the advantage of effectively using multiple test methodologies (e.g., both skewed-load and broad-side methodologies). By varying this aspect of the testing, the fault coverage of the testing may be enhanced.

Figure 10:
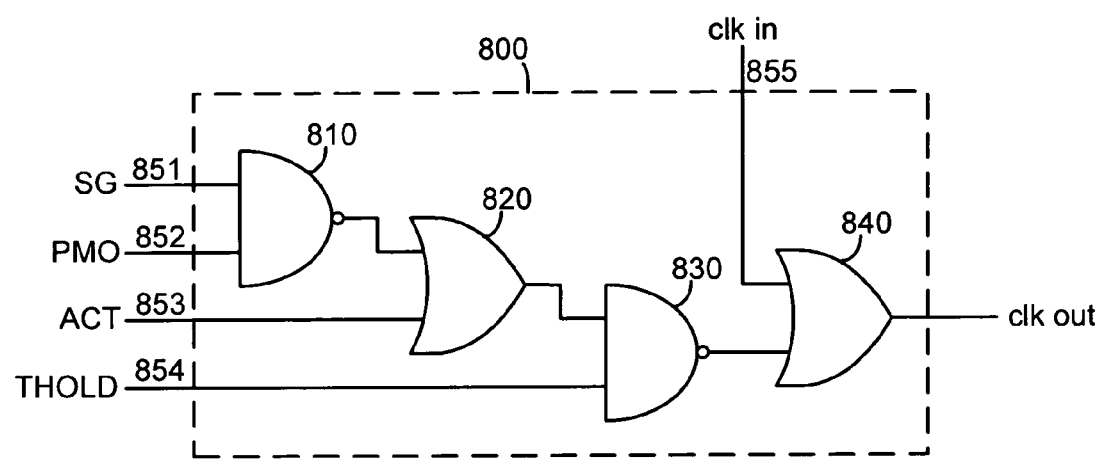
FIG. 10 is a diagram illustrating the design of a local control buffer in accordance with an alternative embodiment.

FIG. 8 describes an LCB that utilizes three inputs—SG, ACT and THOLD signals—to gate a master clock signal through LCB 700. In an alternative embodiment, an additional signal is used to gate the clock signal of the LCB. Referring to FIG. 10, a diagram illustrating the design of an LCB in accordance with this alternative embodiment is shown. As shown in FIG. 10, LCB 800 comprises a series of logic gates, including AND gates 810 and 830 and OR gates 820 and 840.

LCB 800 has five inputs and a single clock output. The five inputs are configured to be coupled to receive input signals which are used to control the output clock signals. Input 851 is coupled to the input of NAND gate 810 and is configured to receive a scan gate signal. This is the same scan gate signal that is mentioned above in relation to FIGS. 7A and 7B. Input 852 is coupled to another input of NAND gate 810 and is configured to receive a power mode override (PMO) signal. When the PMO signal is asserted, all clock pulses are disabled except for functional hold clock pulses. Input 853 is coupled to an input of OR gate 820 and is configured to receive an active (ACT) signal. The ACT signal is dependent upon the functional logic within the logic circuit being tested. Input 854 is coupled to an input of NAND gate 830, and is configured to receive a THOLD signal. The THOLD signal is a test hold signal which is intended to prevent new data from being launched from the scan latches. Finally, input 855 is coupled to one of the inputs of OR gate 840. Input 855 is coupled to a clock source and is configured to receive a master clock signal upon which the output of LCB 800 is based.

Logic gates 810, 820, 830 and 840 are cascaded. That is, the output of NAND gate 810 is provided as an input to OR gate 820, while the output of OR gate 820 is provided as an input to NAND gate 830, and the output of NAND gate 830 is provided as an input to OR gate 840. The respective states of the SG, PMO, ACT and THOLD signals control whether the clock signal received on input 855 is passed through LCB 800. THOLD has the highest priority of these signals. If THOLD is not asserted, the output of NAND gate 830 is 1, so the output of OR gate 840 remains at a value of 1. In other words, no clock pulses are produced. If THOLD is asserted, the output of NAND gate 830 is dependent upon the input received from OR gate 820. If OR gate 820 produces a value of 1, the output of NAND gate 830 is 0, so the master clock signal received on input 855 will be passed through OR gate 840. The output of OR gate 820 is dependent upon the SG, PMO and ACT signals. The output of OR gate 820 will be 0 only if the ACT signal is not asserted and both the SG and PMO signals are asserted. Otherwise, the output of OR gate 820 will be 1. The resulting truth table for gates 810, 820, 830 and 840 is shown in Table 3.

TABLE 3

| inputs | | | | |
|---|---|---|---|---|
| 851 SG | 852 PMO | 853 ACT | 854 THOLD | clock enabled |
| 0/1 | 0 | 0 | 1 | yes |
| 0 | 1 | 0 | 1 | yes |
| 1 | 1 | 0 | 1 | no |

TABLE 3-continued

| inputs | | | | |
|---|---|---|---|---|
| 851 SG | 852 PMO | 853 ACT | 854 THOLD | clock enabled |
| 0/1 | 0/1 | 1 | 1 | yes |
| 0/1 | 0/1 | 0/1 | 0 | no |

It should be noted that, while the LCB configurations illustrated in FIGS. 8 and 10 use an ACT signal generated by actual functional logic to introduce variations in the number of levels of functional logic through which the data from the scan chains is allowed to propagate, this may be accomplished through other means in alternative embodiments. Thus, additional variations on the configuration of the LCB are possible. Moreover, the variability in the number of levels of functional logic through which the data from the scan chains is allowed to propagate may be controlled by a mechanism that is external to, or even entirely separate from the LCB.

In one embodiment, the LCB is used in conjunction with a programmable clock control (PCC). While the LCB controls the actual clock signal that is provided to the scan latches, the PCC is designed to provide the SG and THOLD signals which are input to the LCB. The SG is also input to the scan latches to control whether the latches receive data from the preceding scan latches or from the functional components of the logic circuit.

Figure 11:
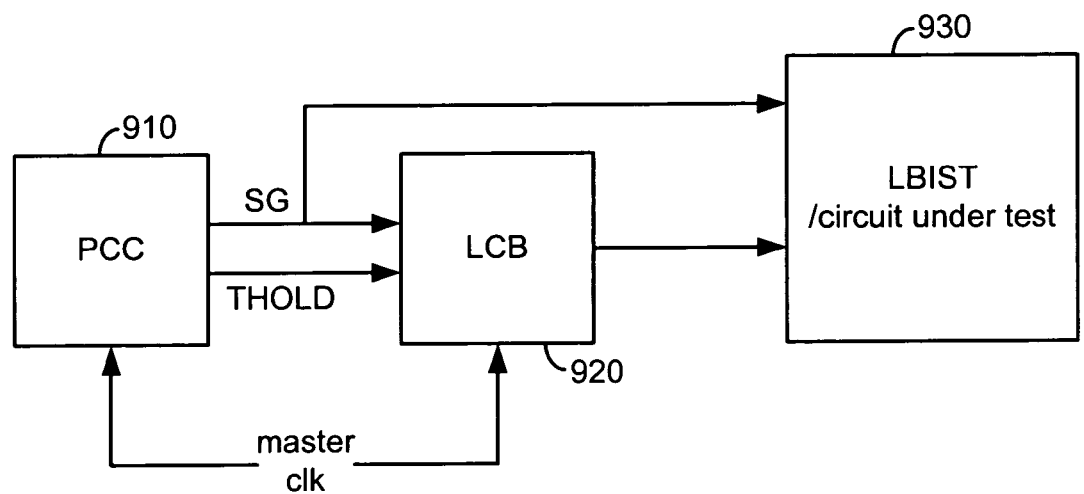
FIG. 11 is a functional block diagram illustrating the interconnection of the programmable clock control with the local control buffer in accordance with one embodiment.

Referring to FIG. 11, a functional block diagram illustrating the interconnection of the PCC with the LCB in accordance with one embodiment is shown. In this embodiment, PCC 910 receives the master clock signal and generates SG and THOLD signals that are transmitted to LCB 920. In addition to the SG and THOLD signals received from PCC 910, LCB 920 receives the master clock signal. Depending upon the particular embodiment of LCB 920, additional inputs to LCB 920 may include the PMO signal and the ACT signal described above. It should be noted that the ACT signal is used in each of these embodiments, but this signal may be generated by functional logic that is incorporated within the logic circuit under test, or it may be generated by functional logic that is separate from the logic circuit under test. LCB 920 then generates the clock signal that is input to the LBIST circuit and the functional logic circuit under test. The LBIST circuit and the functional logic circuit under test also receive the SG signal that is generated by PCC 910.

Figure 12:
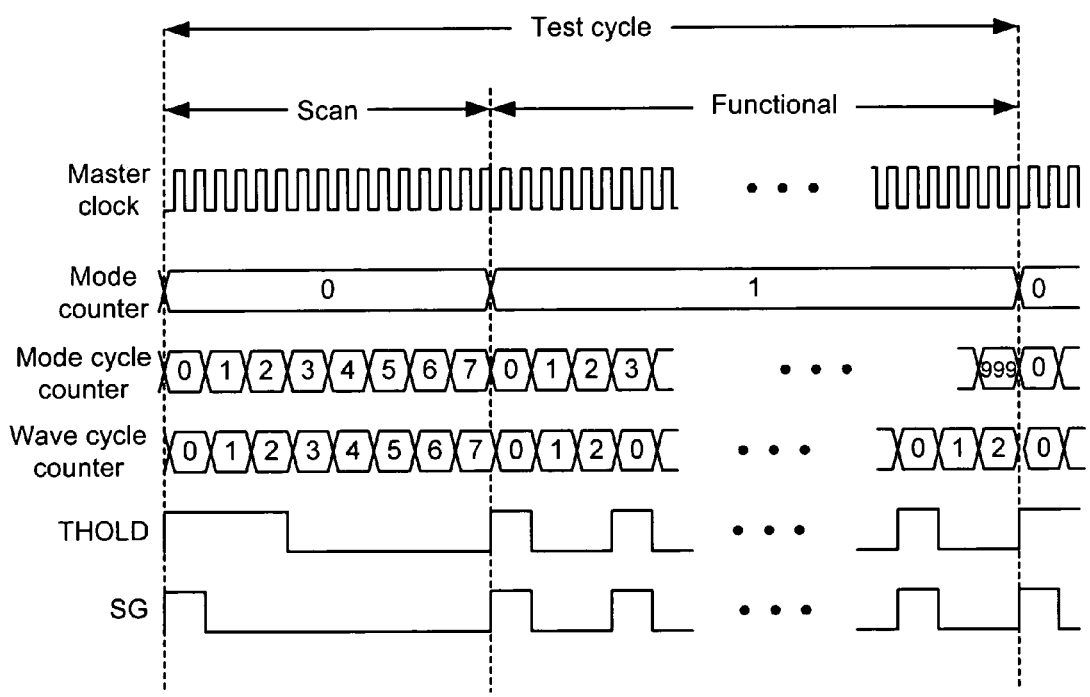
FIG. 12 is a timing diagram illustrating the scan phase and the functional phase of a test cycle in accordance with one embodiment.

Before describing PCC 910 in more detail, it may be helpful to refer to the timing diagram of FIG. 12. FIG. 12 is a timing diagram illustrating the scan phase and the functional phase of a test cycle in accordance with one embodiment. As described above, a test cycle consists of a scan phase and a functional phase. During the scan phase of a test cycle, a pseudorandom bit sequence is scanned into the scan latches. After the bit values are loaded into the scan latches, there is a functional phase during which the data bits of the scan latches are allowed to propagate through the corresponding portion of the functional components of the logic circuit. After the functional phase, the scan phase and functional phase are repeated. Each repetition of a scan phase and a functional phase is referred to herein as a test cycle.

It should be noted that, while the test cycle does not include a scan phase specifically for the purpose of scanning data bits out of the scan latches after a functional phase, the scan phase serves to simultaneously scan these data bits out of the scan latches and to load new pseudorandom bit sequences into the scan latches.

Figure 13:
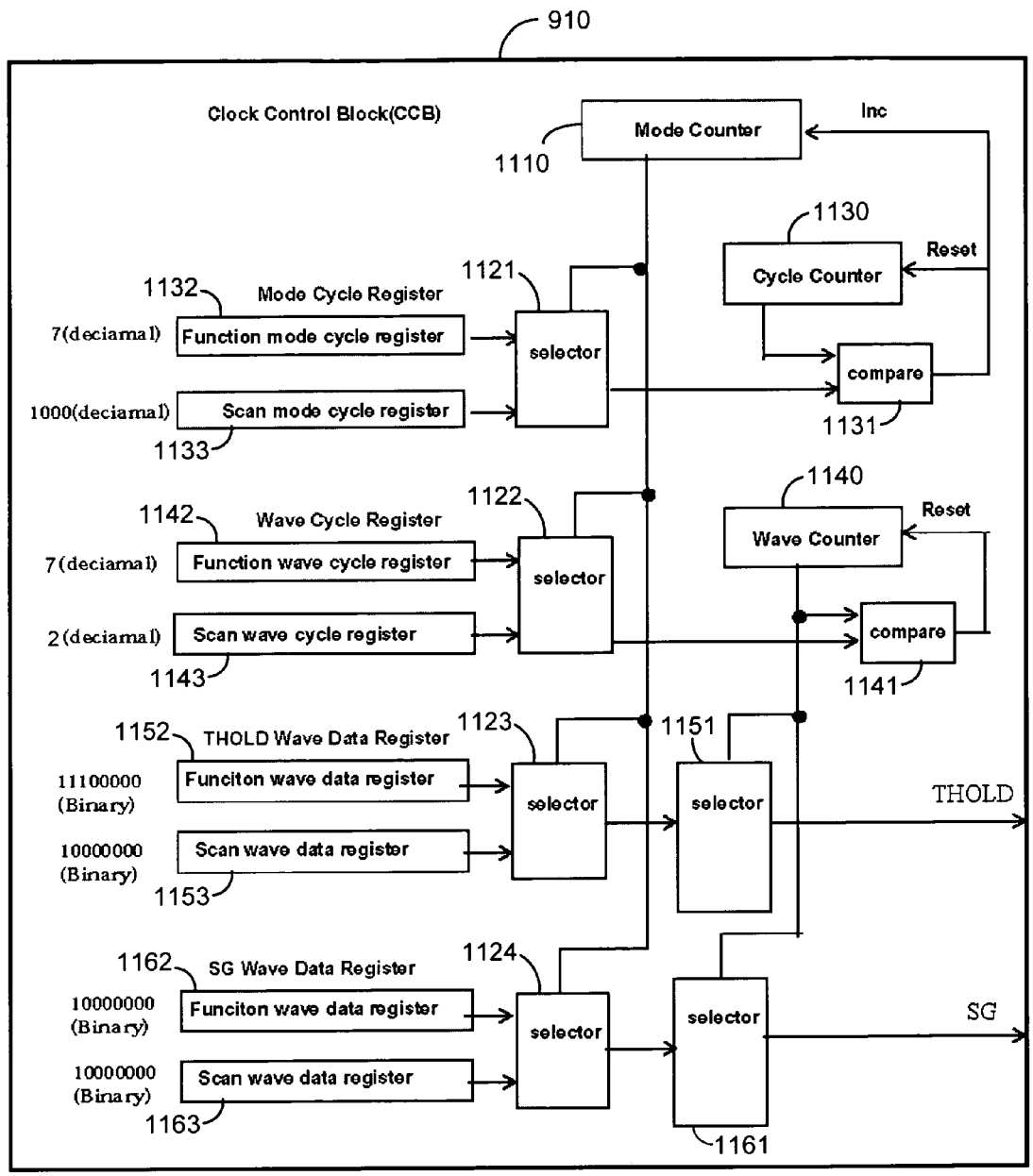
FIG. 13 is a detailed functional block diagram illustrating a programmable clock control in accordance with one embodiment.

Referring to FIG. 13, a more detailed functional block diagram illustrating PCC 910 in accordance with this embodiment is shown. This embodiment includes three counters that are configured to track the mode of the LBIST system (whether the system is in a scan phase or a functional phase), the number of clock cycles of the master clock in the current position in a wave data register.

The first of these counters is mode counter 1110. Referring again to the timing diagram of FIG. 12, the values of mode counter 1110 are shown. During a functional phase, the mode counter value is 0. During a scan phase, the mode counter value is 1. The values stored in mode counter 1110 is used by selectors 1121, 1122, 1123 and 1124 to select an appropriate register from which to read stored data. For each of selectors 1121, 1122, 1123 and 1124, if the value stored in mode counter 1110 is 0, a functional register will be selected. If, the other hand, the value stored in mode counter 1110 is 1, a scan register is selected.

The second counter in PCC 910 is cycle counter 1130. Cycle counter 1130 counts the number of clock cycles of the LCB in the current mode. Cycle counter 1130 is initially set to 0. When a cycle of the LCB clock is detected, cycle counter 1130 is incremented. The values of cycle counter 1130 are illustrated in FIG. 12 with respect to the functional phase and scan phase. As depicted in this figure, cycle counter 1130 counts from 0 to 7 in the functional phase, and from 0 to 999 in the scan phase. These counter ranges correspond to values of 7 and 999 being stored in function mode cycle register 1132 and scan mode cycle register 1133, respectively, as will be described in more detail below.

The value of cycle counter 1130 is compared by comparator 1131 to the value stored in one of mode cycle registers 1132 and 1133. If mode counter 1110 is set to 0, selector 1121 selects function mode cycle register 1132 and provides this value to comparator 1131. If mode counter 1110 is set to 1, selector 1121 selects scan mode cycle register 1133 and provides this value to comparator 1131. When the value of cycle counter 1130 reaches the value of the selected mode cycle register, a reset signal is provided to cycle counter 1130 and to mode counter 1110. When cycle counter 1130 receives the reset signal, cycle counter 1130 is reset to 0. When mode counter 1110 receives the reset signal from comparator 1131, the value stored in mode counter 1110 is toggled. In other words, if 0 is currently stored in mode counter 1110, this value this changed to 1. If 1 is currently stored in mode counter 1110, this value is changed to 0.

The third counter in PCC 910 is wave counter 1140. Wave counter 1140 is configured to count from 0 to a value stored in a selected one of wave cycle registers 1142 and 1143. As with mode cycle registers 1132 and 1133, selector 1122 selects the appropriate one of wave cycle registers 1142 and 1143 based upon the mode value stored in mode counter 1110. If mode counter 1110 is set to 0, selector 1122 selects function wave cycle register 1142 and provides this value to comparator 1141. If mode counter 1110 is set to 1, selector 1122 selects scan wave cycle register 1143 and provides this value to comparator 1141. When the value of wave counter 1140 reaches the value of the selected wave cycle register, a reset signal is provided to wave counter 1140. This reset signal causes wave counter 1140 to reset its value to 0. Wave counter 1140 then continues to count.

Typically, the value in function wave cycle register 1142 is set to a value such that wave counter 1140 will count through the range from 0 to this value once during the functional phase of the test cycle. Thus, if function wave cycle register 1142 is set to 7, wave counter 1140 will count from 0 to 7 during the functional phase of the test cycle. This is illustrated in FIG. 12. The value in scan wave cycle register 1143, on the other hand, is typically set to a value such that wave counter 1140 will count through the range from 0 to this value many times during the scan phase of the test cycle. For example, if scan wave cycle register 1143 contains the value 2, wave counter 1140 will count through the range from 0 to 2 multiple times as cycle counter 1130 counts from 0 to 999. FIG. 12 illustrates the repetitive cycling of wave counter 1140 through the 0–2 range during the scan cycle in accordance with this embodiment.

The value stored in wave counter 1140 is used by selectors 1151 and 1161 to select the appropriate values to provide as output signals THOLD and SG, respectively. Selector 1123 chooses the appropriate one of THOLD wave data registers 1152 and 1153 based upon the value in mode counter 1110. If mode counter 1110 has a 1, function wave data register 1152 will be selected. If a 0 is stored in mode counter 1110, scan wave data register 1153 will be selected. In one embodiment, each of THOLD wave data registers 1152 and 1153 contains eight bits. Selector 1151 will select one of the bits from the appropriate register and provides this debt as the THOLD output signal. As wave counter 1140 increments, selector 1151 will select successive ones of the stored bits to provide as the THOLD output signal. Thus, if wave counter 1140 is at 0, the first bit of the THOLD wave data register will be selected by selector 1151. When wave counter 1140 increments to 1, the second bit of the THOLD wave data register will be selected by selector 1151. When wave counter 1140 resets to 0, the first bit of the THOLD wave data register will again be selected by selector 1151. A repeating pattern corresponding to the data in the THOLD wave data register is thereby generated as the THOLD output signal.

The SG signal output by PCC 910 is generated in much the same manner. Selector 1124 selects one of SG wave registers 1162 and 1163 based upon the value stored in mode counter 1110. As wave counter 1140 increments through its corresponding range of values, selector 1161 selects bits from the selected one of SG wave data registers 1116 and 1163 to provide the SG output signal. Selector 1161 thereby provides a repeating output signal based upon the contents of SG wave data registers 1162 and 1163.

It should be noted that comparators 1131 and 1141 may be configured to issue their respective reset signal when they reach the values in the corresponding selected registers, or when they exceed these values. The values stored in registers 1132,1133, 1142 and 1143 will take into account the operation of comparators 1131 and 1141. For example, if comparator 1131 is configured to start coming at zero and issue a reset signal when the value stored in cycle counter 1130 reaches the value stored in a selected one of mode cycle registers 1132 and 1133, the values stored in mode cycle registers 1132 and 1133 will equal the number of desired cycles, minus one. Thus, if it is desired to have eight cycles in the functional phase, a value of 7 will be stored in the function mode cycle register so that cycle counter 1130 and comparator 1131 will count through the range from 0 to 7. Similarly, if it is desired to have 1000 cycles in the scan phase, a value of 999 will be stored in the scan mode cycle register so that cycle counter 1130 and comparator 1131 will count through the range from 0 to 999.

FIG. 13 shows that, in one embodiment, a value of "11100000" may be stored in function wave data register 1152, while a value of "10000000" may be stored in scan wave data register 1153. During a functional phase, function wave data register 1152 is selected by selector 1123. During the functional phase, wave counter 1140 counts through eight wave cycles (wave counter 1140 counts from 0 to 7) and selector 1151 produces the THOLD signal based upon the bits stored in function wave data register 1152 ("11100000").

Thus, during the eight wave cycles of the functional phase, selector 1151 produces a THOLD signal that is 1 for the first three cycles and 0 for the next five cycles. When PCC 910 goes from the functional mode (mode counter=0) to the scan mode (mode counter=0), selector 1122 chooses scan wave cycle register 1143 (which has a value of two) and selector 1123 chooses scan wave data register 1153 (which contains the bits "10000000"). Selector 1151 therefore produces a THOLD signal that repeats every three cycles instead of every eight cycles, where the repeating pattern is "100" (the first three bits of scan wave data register 1153). The resulting THOLD signal output by selector 1151 (hence PCC 910) throughout the test cycle is shown in FIG. 12. Output signal SG is generated in the same manner, except that the output waveform is based upon the bits stored in SG wave data registers 1162 and 1163. The resulting signal through the test cycle is also shown in FIG. 12.

It should be noted that the system of FIG. 11 may also include one or more components which control the number of test cycles, the bit sequences stored in the registers, and the like. For example, in one embodiment, a control component may be configured to store specific bit sequences in registers 1132, 1133, 1142, 1143, 1152, 1153, 1162 and 1163, then run a specified number of test cycles using the stored bit sequences. The control component may then modify the bit sequences stored in the registers and again run the specified number of test cycles using the stored, modified bit sequences.

While the embodiments of the invention described in the foregoing paragraphs typically comprise hardware systems, it should be noted that there may be many alternative embodiments. For example, portions of the LBIST system, such as the LCB, may be implemented in software modules that are configured to execute on a processor. These software modules may operate exactly as described above, or they may incorporate variations from the foregoing embodiments. For instance, in one embodiment, an LBIST system may use a software module, rather than actual functional logic, to generate an ACT signal that determines the number of levels of logic components in the logic circuit under test through which the data from a scan chain will be propagated. In embodiments of the invention which include software, or which include components comprising software modules, typically have the software embodied in computer-readable media, such as floppy disks, CD-ROMs, and the like.

Other alternative embodiments may comprise methods for improving test fault coverage. For instance, one embodiment may comprise a method for improving fault coverage by introducing variations in the number of levels of functional logic components. This method may comprise the steps of scanning pseudorandom bit sequences into one or more scan chains, determining a number of levels of logic through which to propagate the pseudorandom bit sequences (or the data resulting from the pseudorandom bit sequences), propagating the data from the scan chains through the determined number of levels of logic, capturing the data and scanning the resulting data out of the scan chains. Another embodiment may comprise a method that is as simple as performing BIST testing, where the number of levels of the circuit under test through which to propagate the data from the scan chains from one test cycle to the next is variable.

While the disclosure of the present application discusses the invention in the context of LBIST systems for testing logic circuits, it should be noted that the invention is more widely applicable and can be used in a variety of other contexts. For example, rather than being used to test circuits that comprise only logic gates, some embodiments of the invention may be used to perform BIST-type testing on circuits that include non-logic components. Further, some embodiments of the invention may be implemented wholly or partially in systems that are external to the circuit under test. Consequently, the disclosure should not be considered as limiting the invention to the field of LBIST testing of logic circuits.

"Computer-readable media," as used herein, refers to any medium that can store program instructions that can be executed by a computer, and includes floppy disks, hard disk drives, CD-ROMs, DVD-ROMs, RAM, ROM, DASD arrays, magnetic tapes, floppy diskettes, optical storage devices and the like. "Computer", as used herein, is intended to include any type of data processing system capable reading the computer-readable media and/or performing the functions described herein.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms 'comprises,' 'comprising,' or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A system for testing circuitry comprising:
   a plurality of scan chains extending between functional logic components of a circuit to be tested, and connected to each other through the functional logic components, each of the scan chains including a plurality of scan latches disposed correspondingly to levels of functional logic;
   a pseudorandom pattern generator (PRPG) coupled to the scan chains and configured to generate a pseudorandom pattern of bits to be scanned into the scan chains;
   a controller configured to control test cycles, each of which includes a functional phase in which data is propagated between the scan chains through the functional logic components, and a scan phase in which data is shifted into and out of the scan latches through the scan chains; and a plurality of local control buffers (LCBs) coupled to the scan latches to supply the scan latches with clock signals indicating the number of levels of functional logic through which data is propagated during the functional phase, each LCB of the plurality of LCBs being configured to vary the number of levels of functional logic to be indicated.

2. The system of claim 1, wherein each of the LCB comprises logic circuitry having a plurality of inputs to receive different signals and an output coupled to a corresponding scan latch, the logic circuitry being configured to set different values of the number of levels of functional logic to be indicated, based on combinations of the different signals.

3. The system of claim 1, wherein during a scan phase, the LCB is configured to generate a series of clock pulses to shift data through each of the scan chains, and wherein during a functional phase the LCB is configured to generate a variable number of clock pulses to cause data to propagate through a corresponding number of levels of the circuit under test.

4. The system of claim 3, wherein the LCB is configured to change the variable number of clock pulses in the functional phase in two or more successive test cycles.

5. The system of claim 4, wherein the LCB is configured to change the variable number of clock pulses in the functional phase based upon a pseudorandom input signal.

6. The system of claim 5, wherein the pseudorandom input signal comprises an output of one or more functional logic components in the circuit under test.

7. The system of claim 5, wherein the LCB is configured to change the variable number of clock pulses in the functional phase by suppressing one or more clock pulses during the functional phase based upon the pseudorandom input signal.

8. The system of claim 1, wherein the controller comprises a phase shifter coupled between the PRPG and the scan chains, wherein the phase shifter is configured to shift a phase of the pseudorandom pattern of bits generated by the PRPG before the pseudorandom pattern of bits is scanned into the scan chains.

9. The system of claim 1, wherein the controller comprises a multiple input signature register (MISR) coupled to the scan chains and configured to store a set of data bits corresponding to data scanned out of the scan chains.

10. The system of claim 9, wherein the controller comprises a compactor coupled between the MISR and the scan chains, wherein the compactor is configured to compact the data scanned out of the scan chains before storing the compacted data in the MISR.

11. The system of claim 1, wherein for each scan chain, each of the scan latches is coupled to a demultiplexer, wherein the demultiplexer is configured to select either scan data or functional data and to provide the selected data to the scan latch.

12. The system of claim 11, wherein the demultiplexer is configured to select either scan data or functional data based upon a scan gate signal received at the demultiplexer.

13. The system of claim 11, wherein the demultiplexer is configured to select scan data by selecting an output from a previous scan latch in the corresponding scan chain and to select functional data by selecting an output from a functional logic component of the circuit under test.

14. A method used with a system for testing circuitry, the system comprising:
a plurality of scan chains extending between functional logic components of a circuit to be tested, and connected to each other through the functional logic components, each of the scan chains including a plurality of scan latched disposed correspondingly to levels of functional logic; and
a pseudorandom pattern generator (PRPG) coupled to the scan chains and configured to generate a pseudorandom pattern of bits to be scanned into the scan chains; the method comprising:
(a) filling the scan chains with data comprising a pseudorandom pattern of bits;
(b) performing a functional phase in which data is propagated between the scan chains through the functional logic components;
(c) performing a scan phase in which data is shifted into and out of the scan latches through the scan chains; and
(d) prior to the functional phase, supplying the scan latches with clock signals indicating the number of levels of functional logic through which data is to be propagated during the functional phase, wherein the number of levels of functional logic to be indicated is variable.

15. The method of claim 14, further comprising setting different values of the number of levels of functional logic to be indicated, based on combinations of the different signals.

16. The method of claim 14, wherein determining the number of levels of functional circuitry and corresponding subsequent scan chains through which to propagate the data comprises providing a pseudorandom signal and suppressing one or more clock cycles in a functional phase of a test cycle based upon the pseudorandom signal.

17. The method of claim 16, wherein providing the pseudorandom signal comprises providing an output of one or more functional logic components of a circuit under test.

18. The method of claim 14, further comprising repeating steps (a)–(d).

19. The method of claim 14, further comprising generating the pseudorandom pattern of bits with which the initial scan chains are filled.

20. The method of claim 19, further comprising phase shifting the pseudorandom pattern of bits before filling the initial scan chains with the pseudorandom pattern of bits.

21. The method of claim 14, further comprising capturing data resulting from propagation of the pseudorandom pattern of bits from each initial scan chain in a corresponding one of the subsequent scan chains.

22. The method of claim 21, further comprising transferring the data resulting from propagation of the pseudorandom pattern of bits from the scan chains to a multiple input signature register (MISR).

23. The method of claim 22, further comprising compacting the data resulting from propagation of the pseudorandom pattern of bits from the scan chains before transferring the data to the MISR.

* * * * *